United States Patent
Ogawa et al.

(10) Patent No.: US 7,937,645 B2
(45) Date of Patent: May 3, 2011

(54) SEMICONDUCTOR MEMORY

(75) Inventors: Toshio Ogawa, Kawasaki (JP);
Yoshihiro Takemae, Kawasaki (JP);
Yoshinori Okajima, Kawasaki (JP);
Tetsuhiko Endo, Kawasaki (JP); Yasuro Matsuzaki, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 1354 days.

(21) Appl. No.: 11/443,109

(22) Filed: May 31, 2006

(65) Prior Publication Data

US 2007/0192664 A1    Aug. 16, 2007

(30) Foreign Application Priority Data

Feb. 16, 2006  (JP) .................................. 2006-039854

(51) Int. Cl.
*G11C 29/00*  (2006.01)
(52) U.S. Cl. .......................... 714/763; 714/702; 714/718
(58) Field of Classification Search .................. 714/763, 714/702, 724, 718, 769, 773, 772; 365/201, 365/22, 185.03, 189.15
See application file for complete search history.

(56) References Cited

U.S. PATENT DOCUMENTS

| | | | | |
|---|---|---|---|---|
| 6,571,352 B2 * | 5/2003 | Blodgett | ........................... | 714/6 |
| 6,771,537 B2 * | 8/2004 | Jyouno et al. | ............. | 365/185.03 |
| 6,826,720 B2 * | 11/2004 | Suzuki et al. | .................. | 714/720 |
| 6,842,396 B2 * | 1/2005 | Kono | ........................ | 365/189.15 |
| 6,906,952 B2 * | 6/2005 | Yoshida et al. | ........... | 365/185.03 |
| 6,961,269 B2 * | 11/2005 | Royer | ........................ | 365/189.18 |
| 7,383,445 B2 * | 6/2008 | Tomohiro | ...................... | 713/193 |
| 2005/0141311 A1 * | 6/2005 | Kim et al. | ...................... | 365/222 |

FOREIGN PATENT DOCUMENTS

JP    2005-078459 A    3/2005

* cited by examiner

*Primary Examiner* — Fritz Alphonse
(74) *Attorney, Agent, or Firm* — Arent Fox LLP

(57) ABSTRACT

A conversion control unit sets a converting function of a write data conversion unit or a read data conversion unit enabled or disabled for each controller. Accordingly, for a controller which needs original external data, the external data can be inputted and outputted, whereas for a controller which needs converted internal data, the internal data can be inputted and outputted. A data converting function of a conventional controller can be realized in a semiconductor memory, which can reduce the load on the controller. As a result, the performance of a system can be improved. A disabled controller which has no access right cannot read correct data (original data before conversion). Hence, the security of data written into the semiconductor memory can be protected.

11 Claims, 11 Drawing Sheets ically, encoding and decoding are performed by software or hardware formed in the controller (See Japanese Unexamined Patent Application Publication No. 2005-78459, for example).

SEMICONDUCTOR MEMORY

CROSS REFERENCE TO RELATED APPLICATION

This application is based upon and claims the benefit of priority from Japanese Patent Application No. 2006-039854, filed on Feb. 16, 2006, the entire contents of which are incorporated herein by reference.

BACKGROUND OF THE INVENTION

1. Field of the Invention

The present invention relates to a semiconductor memory having a function of converting data supplied from outside into different data.

2. Description of the Related Art

In order to prevent unauthorized access to data, it is important to convert original data to different data by encoding or the like. In a security system which needs encoding of data, data encoded and stored in a semiconductor memory is read by being decoded. Generally, encoding and decoding are performed by a controller which accesses the semiconductor memory. More specifically, encoding and decoding are performed by software or hardware formed in the controller (See Japanese Unexamined Patent Application Publication No. 2005-78459, for example).

In a conventional security system, encoding and decoding are performed by a controller such as a CPU. The controller encodes data and writes the encoded data into a semiconductor memory. The controller reads the encoded data from the semiconductor memory and decodes the read data into the original data. Alternatively, the controller transfers the encoded data stored in the semiconductor memory to a hard disk drive or the like without decoding it. As just described, only the encoded data is inputted to and outputted from the semiconductor memory.

Generally, shifting a function of the controller to an external device can reduce the load on the controller, improving the performance of a system. However, there has been no semiconductor memory having an encoding function and a decoding function proposed.

For realizing the encoding function and the decoding function within the semiconductor memory, the semiconductor memory needs to input and output both unencoded data and encoded data. Specifically, data supplied from the controller to the semiconductor memory is not encoded. On the other hand, when encoded data in the semiconductor memory is transferred to a hard disk device or the like, the data outputted from the semiconductor memory is encoded. However, the operation technique and circuit technology of the semiconductor memory to deal with input and output of both of the encoded data and unencoded have not been studied. Moreover, the semiconductor memory may be accessed by plural controllers in the system. Hence, for the semiconductor memory having the encoding function and the decoding function, it is necessary to study a new control method for an access right.

SUMMARY OF THE INVENTION

An object of the present invention is to provide a semiconductor memory having a data converting function, thereby improving the performance of a system. In particular, it is to provide a semiconductor memory in which a converting function can be set enabled or disabled, thereby protecting the security of data written into the semiconductor memory.

In one aspect of the present invention, a conversion control unit sets a converting function of a write data conversion unit or a read data conversion unit enabled or disabled for each of controllers which inputs or outputs data to or from a memory cell array. The write data conversion unit, when being set enabled, converts external data supplied from outside into internal data. The internal data is stored in the memory cell array. When being set enabled, the read data conversion unit converts the internal data read from the memory cell array into the original external data. For example, the write data conversion unit or the read data conversion unit performs a converting operation using a conversion key stored in a key register.

The converting functions of the write data conversion unit and the read data conversion unit can be disabled, which makes it possible to write, into the memory cell array, data which is converted internal data supplied from outside. Moreover, the internal data written into the memory cell array can be directly outputted to the outside. Accordingly, it is possible to input and output the original external data to a controller which needs it, and input and output the internal data to a controller which needs it. Namely, necessary data can be inputted and outputted to each controller. Accordingly, a data converting function of a conventional controller can be realized in the semiconductor memory, which can reduce the load on the controller. As a result, the performance of a system can be improved.

Further, for example, a disabled controller which has no access right to the semiconductor memory cannot read correct data (original data before conversion). Hence, it is able to protect the security of data written into the semiconductor memory.

In a preferred example of the one aspect of the present invention, the write data conversion unit and the read data conversion unit perform a converting operation based on a conversion method which corresponds to conversion information stored in a conversion register. Since plural conversion methods can be selectively used, the security of data written into the semiconductor memory can be improved. An optimal conversion method can be set according to the system in which the semiconductor memory is mounted.

In a preferred example of the one aspect of the present invention, a size of a memory area assigned to the memory cell array to store the internal data is changed according to a set value of an area register. Therefore, the semiconductor memory having the memory area of the most suitable capacity for the specification of the system can be implemented by one chip.

In a preferred example of the one aspect of the present invention, enable registers store enable information indicating that the write data conversion unit and the read data conversion unit are enabled/disabled, in association with each controller. The conversion control unit sets the write data conversion unit or the read data conversion unit enabled or disabled according to the enable information held in the enable registers. This makes it possible to prohibit the converting operation when the semiconductor memory is accessed by a controller which does not have an access right. Accordingly, the security of data held in the semiconductor memory can be protected.

In a preferred example of the one aspect of the present invention, a code generating unit generates an error correction code to correct an error in the internal data. An error correcting unit detects an error in the internal data using the error correction code and corrects the error when it is correctable. The memory cell array stores the error correction code in an error code area. With an additional error correcting function, data reliability can be improved.

In a preferred example of the one aspect of the present invention, the write data conversion unit and the read data conversion unit are formed in a field programmable unit in which logic is programmable. A program to construct the logic in the field programmable unit is stored in a nonvolatile program area. As a result, a data converting function can be changed on the system according to the specification of the system.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
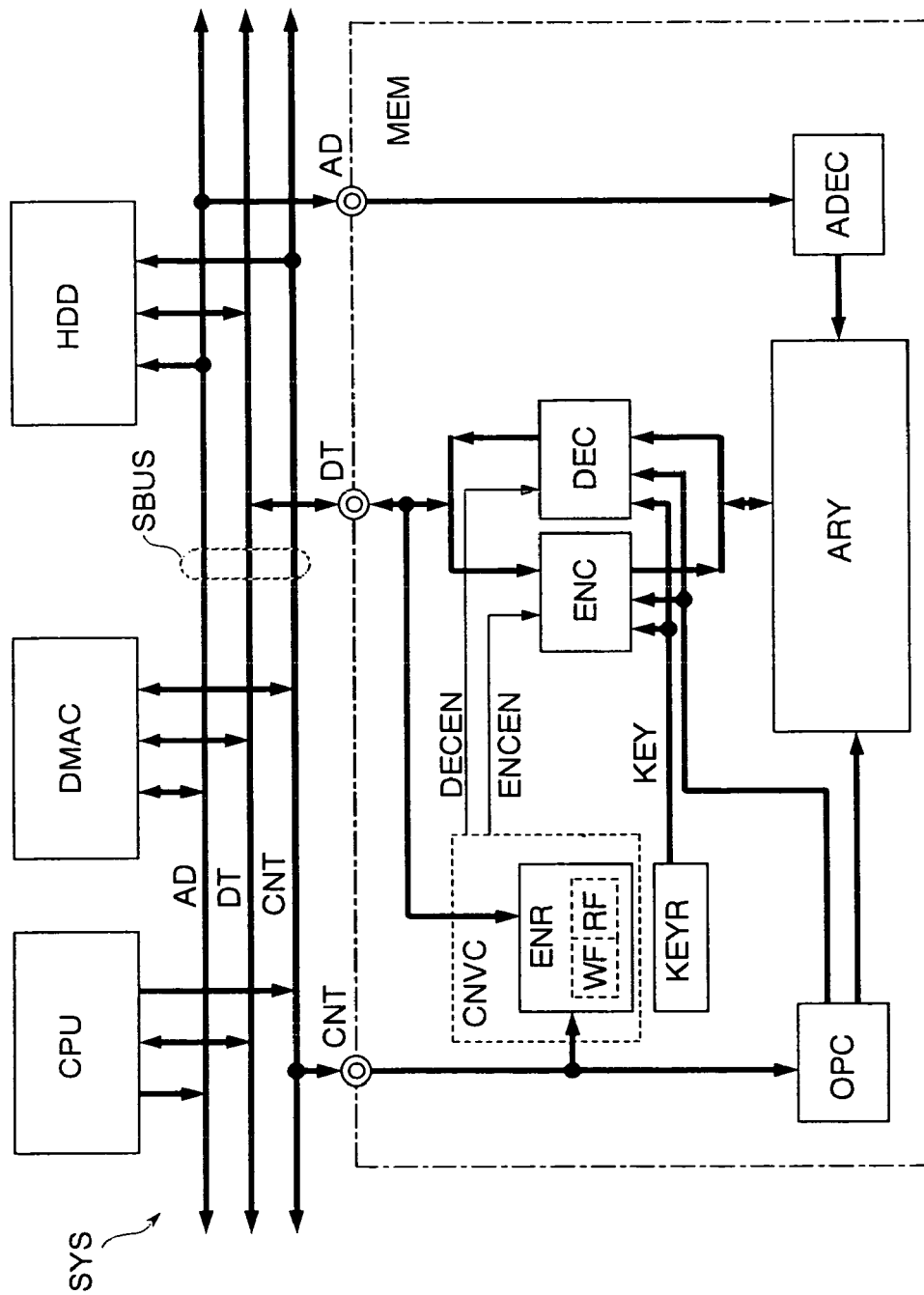
FIG. 1 is a block diagram showing a first embodiment of the present invention.

Embodiments of the present invention will be described below using the drawings. Double circles in the drawings show external terminals which receive external signals. Signal lines shown by thick lines are each composed of plural lines. Part of blocks to which the thick lines are connected are each composed of plural circuits. The same symbols as those of signals are used to designate signal lines to which the signals are transmitted.

FIG. 1 shows a first embodiment of the present invention. A semiconductor memory MEM includes, for example, DRAM memory cells (dynamic memory cells), and it is formed as an FCRAM (Fast Cycle RAM) chip having an SRAM interface. An FCRAM is a kind of pseudo SRAM, and it performs a refresh operation at regular intervals inside the chip without receiving a refresh command from outside and holds data written into the memory cell. The semiconductor memory MEM is connected to a microcontroller CPU, a DMAC (Direct Memory Access Controller), and a hard disk drive device HDD via a system bus SBUS on a system board. The memory MEM, the CPU, the DRAM, and the HDD constitute a system SYS. Incidentally, the system SYS may be constituted using SIP (System In Package) technology.

The CPU controls the operation of the entire system SYS, and reads and writes data from and to the memory MEM. The DMAC transfers data between the memory MEM and the HDD in response to a transfer request from the CPU. The system bus SBUS is composed of an address line AD, a data line DT, and a control line CNT. A control signal CNT is, for example, a chip select signal and a write enable signal, and it is outputted from the CPU and the DMAC to the memory MEM and the HDD.

In this embodiment, encoded internal data is written into the memory MEM and the HDD. Data inputted and outputted between the CPU and the memory MEM is unencoded external data. Data inputted and outputted between the memory MEM and the HDD by the operation of the DMAC is the encoded internal data. Namely, both the encoded data and the unencoded data are transmitted on the data line DT. Accordingly, the memory MEM needs to distinguish whether received data is encoded or not according to a controller (the CPU or the DMAC in this example) which accesses it. The memory MEM further needs to determine whether to output encoded data or decoded data according to a controller (the CPU or the HDD in this example) to which the data is to be transferred.

The memory MEM includes an encoder ENC (write data conversion unit), a decoder DEC (read data conversion unit), a conversion control unit CNVC including an enable register ENR, a key register KEYR, an operation control circuit OPC, a memory cell array ARY, and an address decoder ADEC.

The encoder ENC encodes data received by an external data terminal DT when an encode enable signal ENCEN is activated to a high level and outputs the encoded data to the memory cell array ARY. The encoder ENC disables an encoding function when the encode enable signal ENCEN is deactivated to a low level. Therefore, the data received by the external data terminal DT is outputted to the memory cell array ARY through the encoder ENC.

The decoder DEC decodes the encoded data read from the memory cell array ARY when a decode enable signal DECEN is activated to a high level and outputs the decoded data to the external data terminal DT. The decoder DEC disables a decoding function when the decode enable signal DECEN is deactivated to a low level. Therefore, the encoded data read from the memory cell array ARY is outputted to the external data terminal DT through the decoder DEC without being decoded.

The enable register ENR includes a write flag WF which stores enable information indicating that the encoder ENC is enabled/disabled and a read flag RF which stores enable information indicating that the decoder DEC is enabled/disabled. The enable register ENR can be rewritten from outside the memory MEM. For example, the enable register ENR is assigned to an I/O space of the CPU.

The conversion control unit CNVC activates the encode enable signal ENCEN to the high level when the write flag WF is set enabled and deactivates the encode enable signal ENCEN to the low level when the write flag WF is set disabled. The conversion control unit CNVC further activates the decode enable signal DECEN to the high level when the read flag RF is set enabled and deactivates the decode enable signal DECEN to the low level when the read flag RF is set disabled.

Switching between the input and output of the unencoded data to and from the memory MEM and the input and output of the encoded data to and from the memory MEM can be easily performed according to the set state of the enable register ENR. This makes it possible to realize the encoding function and the decoding function within the memory MEM and reduce the load on the CPU. As a result, the performance of the system SYS can be improved.

The key register KEYR stores a conversion key to be used for compression and decoding. The conversion key is written into the key register KEYR in a manufacturing process of the memory MEM. For example, information in the conversion key is formed as a pattern of a photomask to form a wiring layer. Incidentally, the key register KERY may be formed using a RAM or a latch in order to make it readable and writable. Moreover, a conversion key for compression and a conversion key for decoding may be respectively stored in the key register KEYR depending on a compression/decoding method.

The operation control circuit OPC outputs an access control signal to access the memory cell array ARY according to a command signal supplied via an external control terminal CNT. The operation control circuit OPC controls the operation timings of the encoder ENC and the decoder DEC. The address decoder ADEC decodes an address signal AD supplied via an external address terminal AD and outputs a decode signal for selecting a memory cell to be accessed. The memory cell array ARY includes memory cells arranged in a matrix.

In this embodiment, the CPU writes data received from outside the system SYS or data generated inside the system SYS into the memory MEM. Before writing the data into the memory MEM, the CPU accesses the enable register ENR and sets the write flag WF enabled. This makes the encoding function of the encoder ENC enabled. The data transferred from the CPU is written into the memory cell array ARY after being encoded by the encoder ENC.

Further, before reading data held in the memory MEM, the CPU accesses the enable register ENR and sets the read flag RF enabled. This makes the decoding function of the decoder DEC enabled. In order to restore original data, the decoder DEC decodes the data read from the memory cell array ARY and outputs the decoded data to the external data terminal DT.

On the other hand, when transferring the data held in the memory MEM to the HDD, the CPU accesses the enable register ENR and sets the read flag RF disabled before transferring a use right of the system bus SBUS to the DMAC. This makes the decoding function of the decoder DEC disabled. After this, the operation of the DMAC is started by the CPU making a transfer start request to the DMAC. For example, the DMAC alternately performs read access to the memory MEM and write access to the HDD. The decoder DEC outputs the data read from the memory cell array ARY as it is to the external data terminal DT without decoding it. Namely, the encoded data is written into the HDD.

Furthermore, when transferring data held in the HDD to the memory MEM, the CPU accesses the enable register ENR and sets the write flag WF disabled before transferring the use right of the system bus SBUS to the DMAC. This makes the encoding function of the encoder ENC disabled. After this, the encoded data is transferred from the HDD to the memory MEM by the CPU making a transfer start request to the DMAC. The encoder ENC writes the data supplied from the HDD as it is into the memory cell array ARY without encoding it. Namely, the encoded data is transferred from the HDD to the memory MEM. As just described, the data (encoded data) written into the memory MEM is decoded only by read access by the CPU. As a result, the security of data written into the memory MEM can be protected.

Note that the CPU may disable the write flag WF and the read flag RF during a test mode where the operation of the memory cell array ARY is tested. In this case, the CPU can write data into the memory cell without encoding the data and read data from the memory cell without decoding the data. As a result, the operation of the memory cell array ARY can be easily tested.

As described above, in the first embodiment, the encoding function and the decoding function can be realized within the memory MEM, which makes it possible to reduce the load on the CPU and improve the performance of the system SYS. Since the encoding function and the decoding function are disabled when a controller (DMAC) other than the CPU accesses the memory MEM, the security of data written into the memory MEM can be protected.

Figure 2:
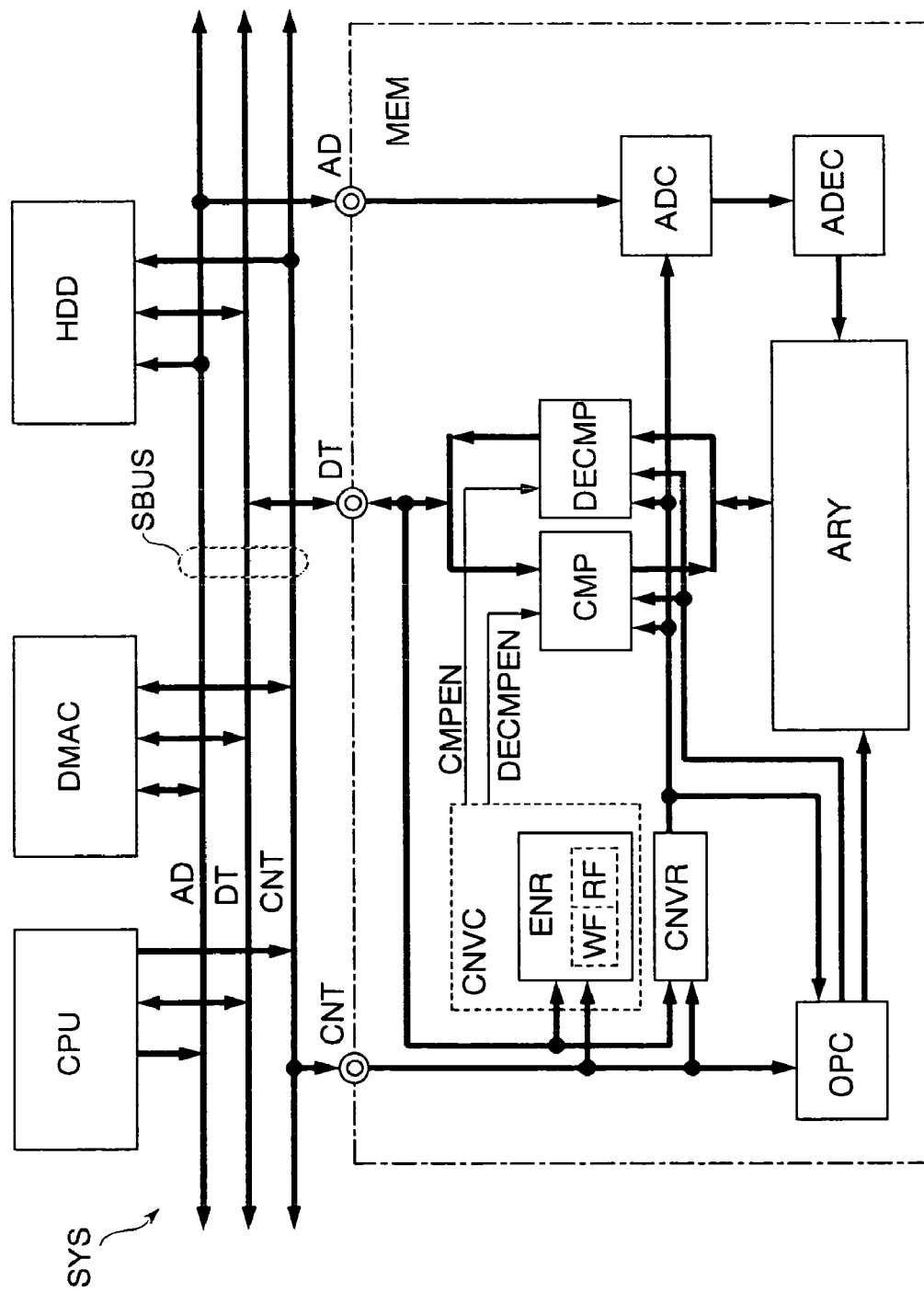
FIG. 2 is a block diagram showing a second embodiment of the present invention.

FIG. 2 shows a second embodiment of the present invention. The same symbols are used to designate elements of the same kinds as those described in the first embodiment, and a detailed description thereof is omitted. In this embodiment, the memory cell array ARY and the hard disk drive device HDD hold compressed data instead of encoded data. Therefore, the semiconductor memory MEM includes a compressing unit CMP (write data conversion unit) and a decompressing unit DECMP (read data conversion unit) in place of the encoder ENC and the decoder DEC of the first embodiment. The compressing unit CMP has a data compressing function. The decompressing unit DECMP has a data decompressing function.

The semiconductor memory MEM includes a conversion register CNVR in place of the key register KEYR of the first embodiment. Further, the semiconductor memory MEM includes an address converting unit ADC to convert the address AD received by the address terminal AD according to algorithms for compression and decompression. The other configuration is substantially the same as that of the first embodiment. Namely, the semiconductor memory MEM is formed as an FCRAM. Uncompressed data is transferred between the CPU and the memory MEM. Compressed data is transferred between the memory MEM and the HDD using the DMAC.

The conversion register CNVR stores conversion information indicating an algorithm (conversion method) to compress or decompress data. The conversion register CNVR is connected to the data line DT, and it can be rewritten from outside the memory MEM. For example, the conversion register CNVR is assigned to the I/O space of the CPU.

When a compressing enable signal CMPEN is activated, the compressing unit CMP selects one of plural kinds of algorithms based on the information stored in the conversion register CNVR. The compressing unit CMP compresses data received by the external data terminal DT using the selected algorithm and writes the compressed data into the memory cell array ARY. The amount of data written into the memory cell array ARY is reduced by the compression. Therefore, the address converting unit ADC converts the address AD to be supplied to the address decoder ADEC according to the amount of compression (algorithm). Also, the operation control circuit OPC changes the number of outputs of the access control signal to be outputted to the memory cell array ARY and so on according to the amount of compression of data. When the compressing enable signal CMPEN is deactivated, the compressing unit CMP writes the data received by the external data terminal DT into the memory cell array ARY without compressing it.

When a decompressing enable signal DECMPEN is activated, the decompressing unit DECMP selects one of plural kinds of algorithms based on the information stored in the conversion register CNVR. The decompressing unit DECMP decompresses data read from the memory cell array ARY using the selected algorithm and outputs the decompressed data to the external data terminal DT. Also when the data is decompressed, the address converting unit ADC converts the address AD to be supplied to the address decoder ADEC, and the operation control circuit OPC changes the number of outputs of the access control signal and so on. When the decompressing enable signal DECMPEN is deactivated, the decompressing unit DECMP outputs the data read from the memory cell array ARY to the external data terminal DT without decompressing it.

In this embodiment, as in the first embodiment, in the operation of writing into the memory MEM by the CPU, data outputted from the CPU is written into the memory cell array ARY after being compressed. In the operation of reading from the memory MEM by the CPU, compressed data read from the memory cell array ARY is outputted from the memory MEM to the CPU after being decompressed. In data transfer from the HDD to the memory MEM by the DMAC, compressed data outputted from the HDD is written as it is into the memory cell array ARY. In data transfer from the memory MEM to the HDD by the DMAC, compressed data read from the memory cell array ARY is outputted as it is to the HDD without being decompressed.

When the operations of writing into and reading from the memory MEM are performed, the CPU sets the write flag WF and the read flag RF enabled respectively. When data is transferred between the memory MEM and the HDD by the DMAC, the CPU sets the write flag WF and the read flag RF disabled respectively. As just described, the method of setting the enable register ENR and the operation of the conversion control unit CNVC are the same as those in the first embodiment.

As described above, also in the second embodiment, the same effect as in the first embodiment can be obtained. More specifically, the compressing function and the decompressing function can be realized within the memory MEM, which makes it possible to reduce the load on the CPU and improve the performance of the system SYS. Since the compressing function and the decompressing function are disabled when a controller other than the CPU accesses the memory MEM, the security of data written into the memory MEM can be protected.

Figure 3:
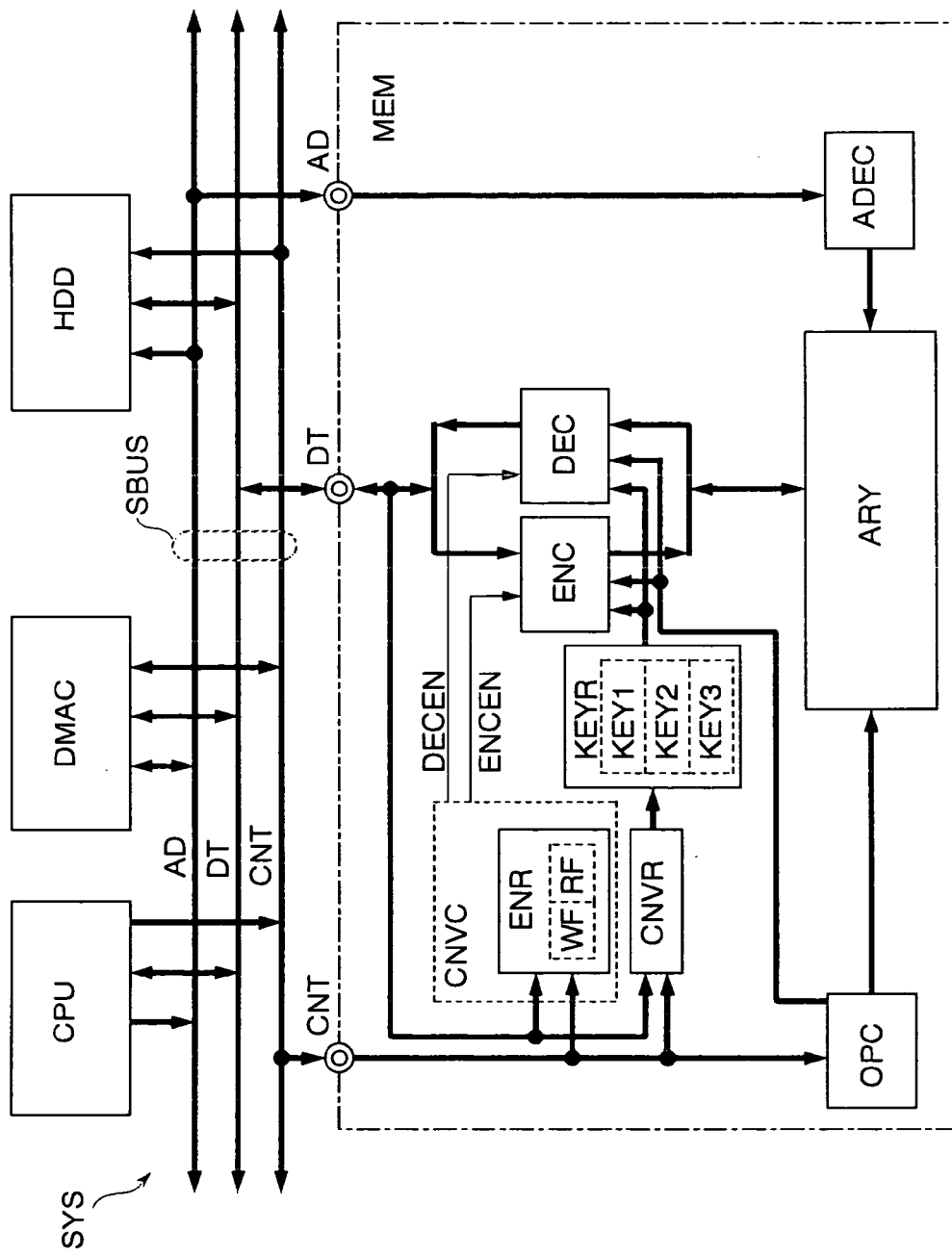
FIG. 3 is a block diagram showing a third embodiment of the present invention.

FIG. 3 shows a third embodiment of the present invention. The same symbols are used to designate elements of the same kinds as those described in the first and second embodiments, and a detailed description thereof is omitted. In this embodiment, the semiconductor memory MEM includes the conversion register CNVR and the key register KEYR. The key register KEYR includes a key area which stores three kinds of conversion keys KEY1-KEY3. The key area is, for example, constituted by a ROM. The other configuration is the same as that of the first embodiment. Namely, the semiconductor memory MEM is an FCRAM. Unencoded data is transferred between the CPU and the memory MEM. Encoded data is transferred between the memory MEM and the HDD using the DMAC.

In this embodiment, the encoder ENC encodes data using the conversion key KEY (any of KEY1-KEY3) which corresponds to conversion information stored in the conversion register CNVR. Similarly, the decoder DEC decodes data using the conversion key KEY (any of KEY1-KEY3) which corresponds to conversion information stored in the conversion register CNVR.

As described above, also in the third embodiment, the same effect as in the first embodiment can be obtained. Moreover, the conversion key KEY used for encoding and decoding can be selected. This makes it possible to set rules for encoding and decoding optimally according to the system SYS in which the semiconductor memory MEM is mounted.

Figure 4:
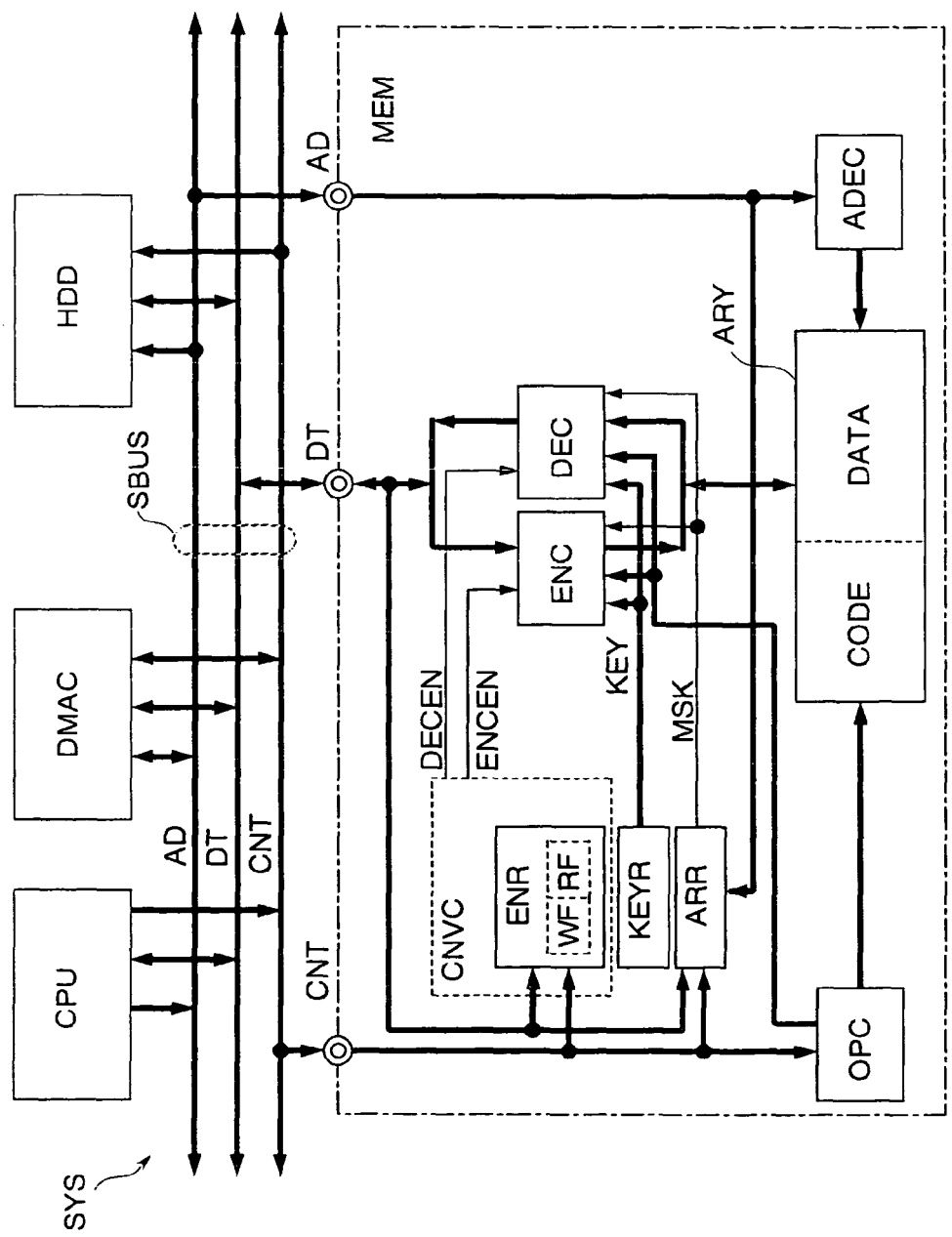
FIG. 4 is a block diagram showing a fourth embodiment of the present invention.

FIG. 4 shows a fourth embodiment of the present invention. The same symbols are used to designate elements of the same kinds as those described in the first embodiment, and a detailed description thereof is omitted. In this embodiment, the memory cell array ARY can change the size of a code area CODE which stores encoded data. Therefore, an area register ARR is newly formed. The other configuration is the same as that of the first embodiment except that a mask signal MSK is supplied to the encoder ENC and the decoder DEC. Namely, the semiconductor memory MEM is an FCRAM. Unencoded data is transferred between the CPU and the memory MEM. Encoded data is transferred between the memory MEM and the HDD using the DMAC.

The area register ARR can be rewritten by the CPU and stores a start address and an end address of the code area CODE where the encoded data is to be stored. For example, the area register ARR is assigned to the I/O space of the CPU. The area register ARR deactivates the mask signal MSK to a low level when the address AD indicating the code area CODE is supplied. The area register ARR activates the mask signal MSK to a high level when the address AD indicating an unencoded ordinary data area DATA (area except the code area CODE) is supplied.

The encoder ENC enables/disables the encoding function according to the value of the flag WF when receiving the deactivated mask signal MSK. More specifically, the encoding function becomes enabled at the time of a write operation by the CPU and becomes disabled only at the time of a write operation by the DMAC. In other words, the CPU has an access right to the code area CODE, whereas the DMAC does not have the access right to the code area CODE. The encoder ENC disables the encoding function regardless of the value of the flag WF when receiving the activated mask signal MSK.

Similarly, the decoder DEC enables/disables the decoding function according to the value of the flag RF when receiving the deactivated mask signal MSK. More specifically, the decoding function becomes enabled at the time of a read operation by the CPU and becomes disabled only at the time of a read operation by the DMAC. In other words, the CPU has the access right to the code area CODE, whereas the DMAC does not have the access right to the code area CODE. As just described, the enable register ENR functions as an access register which can set an access right to the memory cell array ARY with respect to each controller (CPU, DMAC). The decoder DEC disables the decoding function regardless of the value of the flag RF when receiving the activated mask signal MSK. Hence, only the encoded data is inputted to and outputted from the code area CODE, and only the unencoded ordinary data is inputted to and outputted from the ordinary data area DATA.

Figure 5:
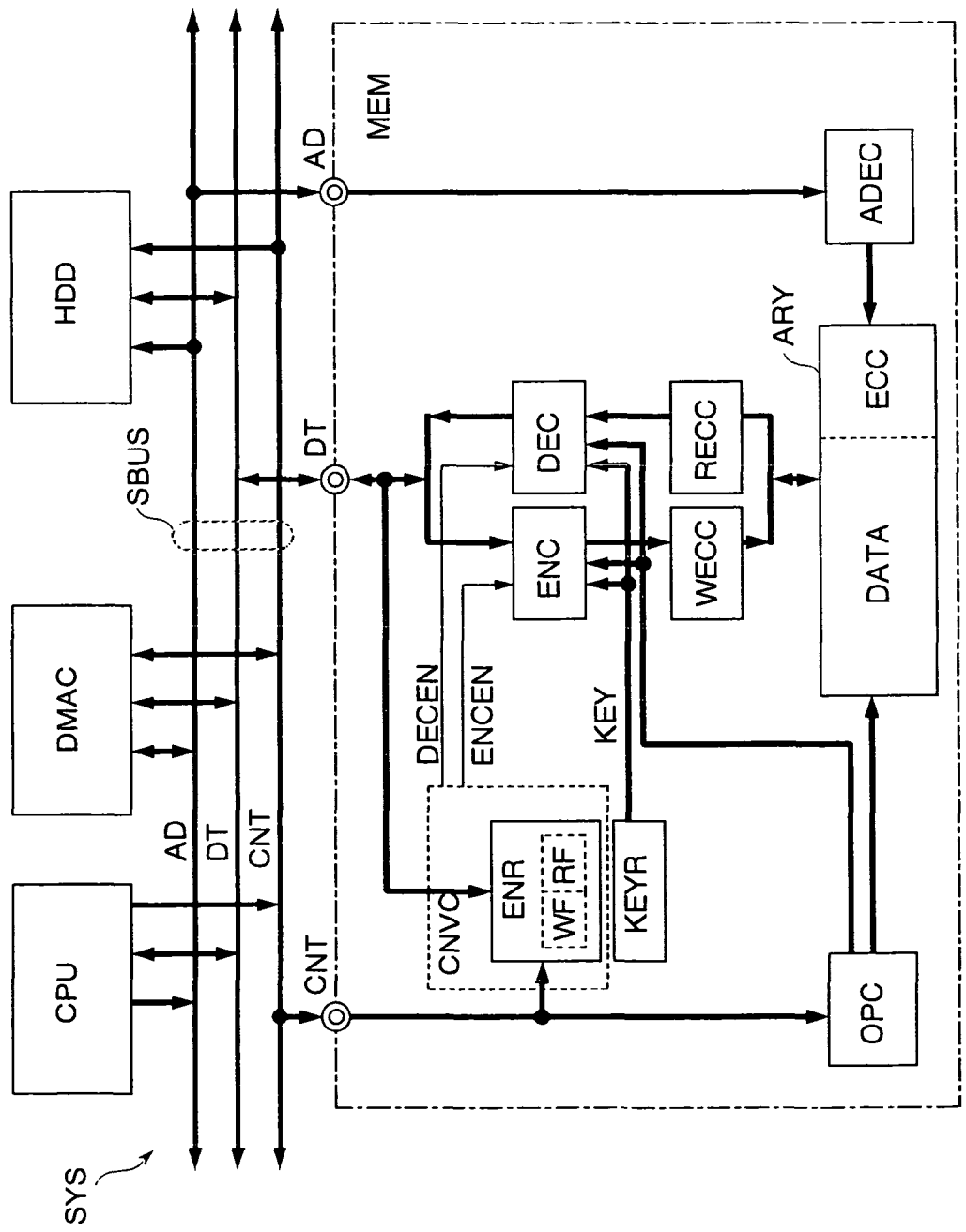
FIG. 5 is a block diagram showing a fifth embodiment of the present invention.

As described above, also in the fourth embodiment, the same effect as in the first embodiment can be obtained. Further, even when the memory cell array ARY is divide into the code area CODE and the ordinary data area DATA, only the encoded data can be inputted to and outputted from the code area CODE. Furthermore, since the size of the code area CODE can be changed, the most suitable semiconductor memory for the specification of the system SYS (the amount of data to be encoded) can be realized by one chip. FIG. 5 shows a fifth embodiment of the present invention. The same symbols are used to designate elements of the same kinds as those described in the first embodiment, and a detailed description thereof is omitted. In this embodiment, a code generating unit WECC which generates an error correction code to correct an error in encoded data and an error correcting unit RECC which corrects the error in the data using the error correction code are added to the semiconductor memory MEM of the first embodiment. The memory cell array ARY includes the data area DATA which stores the encoded data and an error code area ECC which stores the error correction code. The other configuration is the same as that of the first embodiment. Namely, the semiconductor memory MEM is an FCRAM. Unencoded data is transferred between the CPU and the memory MEM. Encoded data is transferred between the memory MEM and the HDD using the DMAC.

The code generating unit WECC generates the error correction code of the encoded data outputted from the encoder ENC and writes the error correction code with the encoded data into the memory cell array ARY. The error correction code is constantly generated regardless of the logic of the decode enable signal DECEN. The error correcting unit RECC detects the error in the encoded data read from the memory cell array ARY using the error correction code and corrects the error which is correctable. The error is always corrected regardless of the logic of the encode enable signal ENCEN.

As described above, also in the fifth embodiment, the same effect as in the first embodiment can be obtained. Moreover, by adding an error correcting function, data reliability can be improved.

Figure 6:
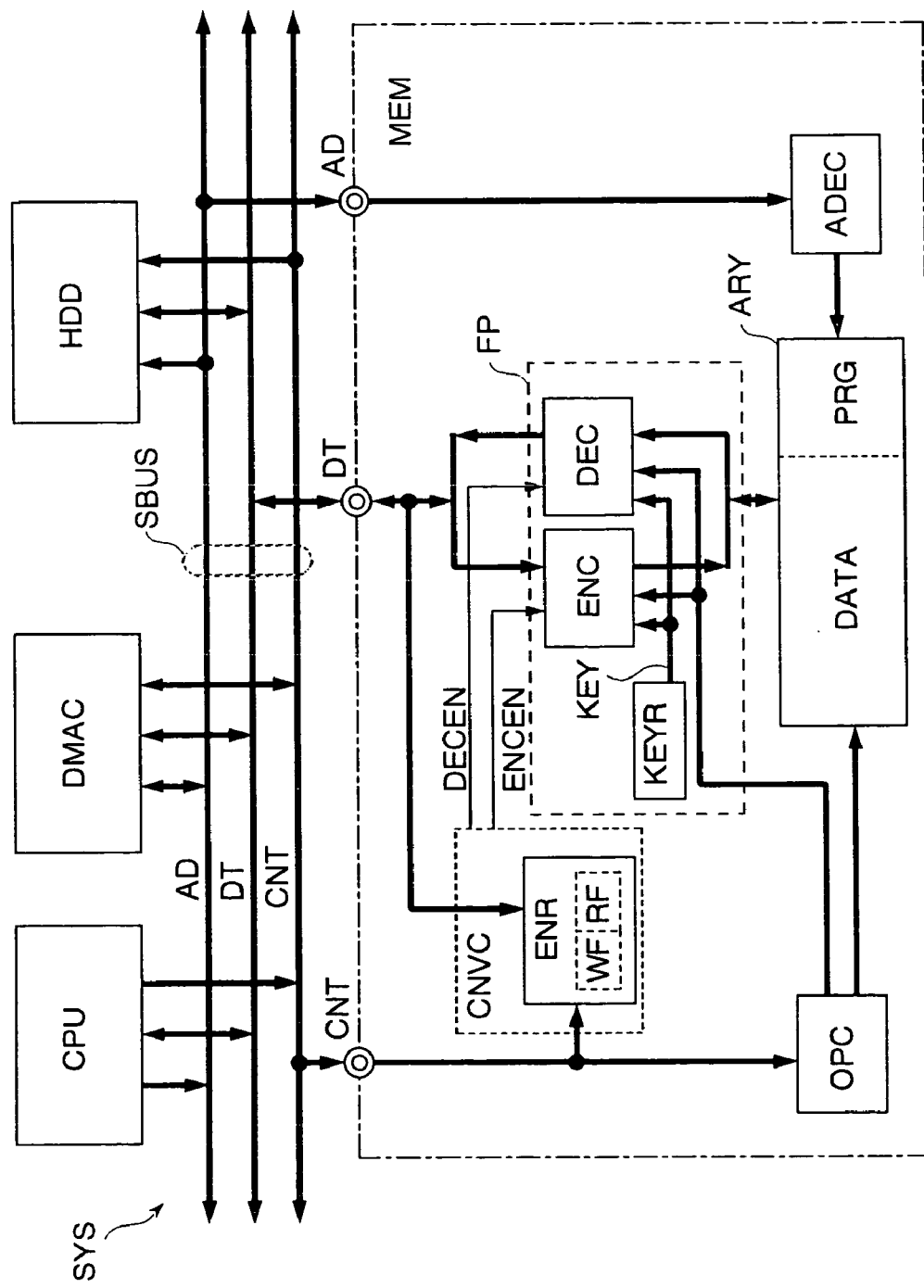
FIG. 6 is a block diagram showing a sixth embodiment of the present invention.

FIG. 6 shows a sixth embodiment of the present invention. The same symbols are used to designate elements of the same kinds as those described in the first embodiment, and a detailed description thereof is omitted. In this embodiment, the semiconductor memory MEM is a nonvolatile memory such as a flash memory. The encoder ENC, the decoder DEC, and the key register KEYR are formed in a field programmable unit FP in which logic can be programmed. The memory cell array ARY includes the data area DATA which stores encoded data and a program area PRG which stores a program to program the logic in the field programmable unit FP. The other configuration is the same as that of the first embodiment. Namely, unencoded data is transferred between the CPU and the memory MEM. Encoded data is transferred between the memory MEM and the HDD using the DMAC.

The field programmable unit FP is, for example, composed of many logical elements and many switching elements to connect the logical elements. The switching element is formed by using a volatile memory cell (SRAM memory cell, for example). In this embodiment, by rewriting the program, the functions of the encoder ENC and the decoder DEC and the conversion key KEY can be changed. Since the program area PRG is formed inside the memory cell array MEM, the program can be rewritten by the CPU getting write access to the memory MEM. The data terminal DT functions as a program input terminal to store the program in the program area.

As described above, also in the sixth embodiment, the same effect as in the first embodiment can be obtained. Moreover, since the logics of the encoder ENC, the decoder DEC, and the key register KEYR can be programmed, algorithms for encoding and decoding can be changed on the system SYS in conformity with the specification of the system SYS. In other words, plural algorithms for encoding and decoding can be addressed by developing one semiconductor memory MEM.

Figure 7:
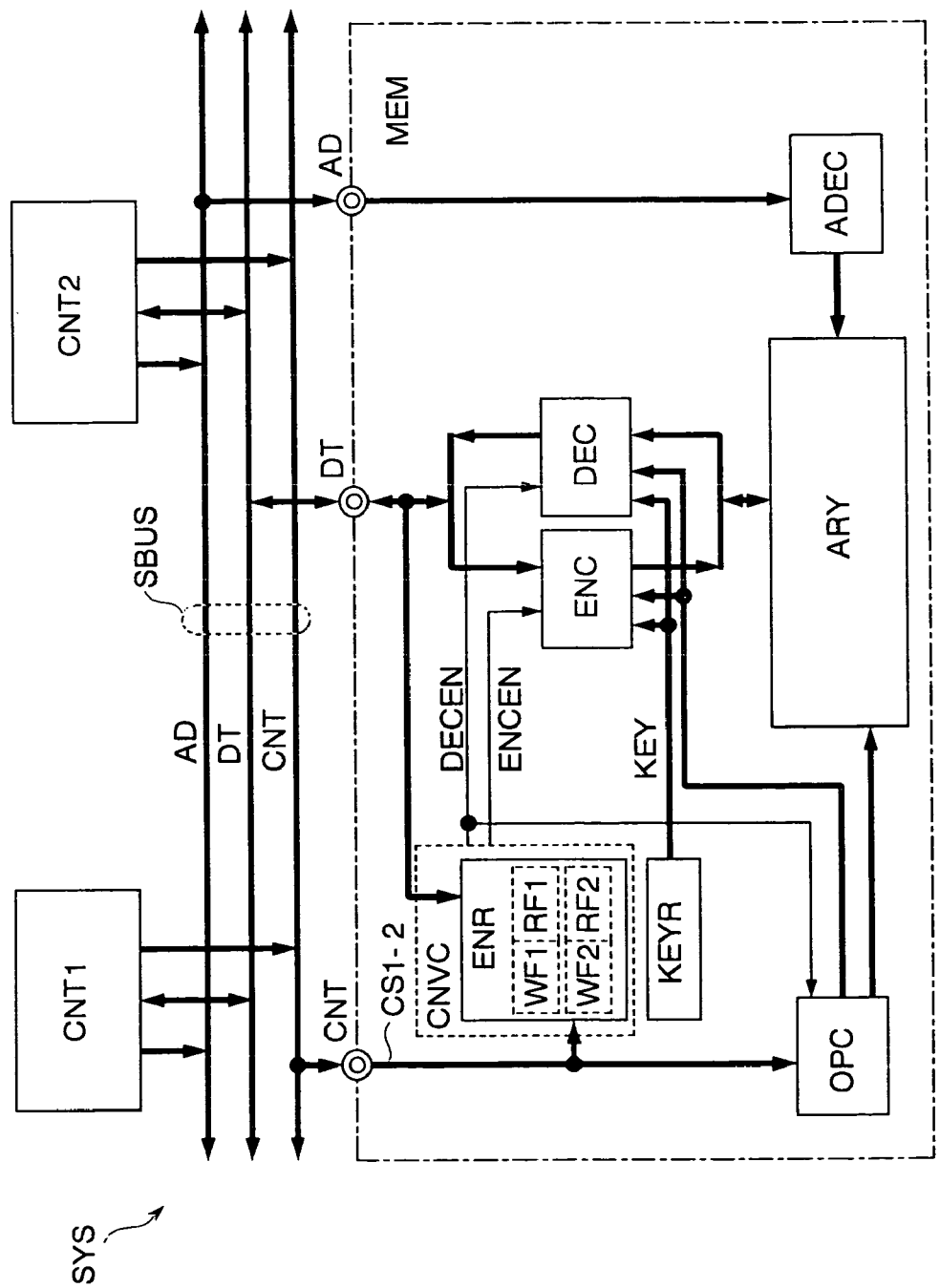
FIG. 7 is a block diagram showing a seventh embodiment of the present invention.

FIG. 7 shows a seventh embodiment of the present invention. The same symbols are used to designate elements of the same kinds as those described in the first embodiment, and a detailed description thereof is omitted. This embodiment is applied to the semiconductor memory MEM connected to plural controllers CNT1-2 such as the CPU and the like via the system bus SBUS. Note, however, that, for example, the controller CNT1 has the access right to the semiconductor memory MEM. The controller CNT2 does not have the access right to the semiconductor memory MEM. The enable register ENR of the semiconductor memory MEM includes write flags WF1 and WF2 and read flags RF1 and RF2 corresponding to the controllers CNT1-2, respectively. The other configuration of the semiconductor memory MEM is substantially the same as that of the first embodiment. Incidentally, when two or more controllers CS1-2 each having the access right to the semiconductor memory MEM are provided, an arbiter to arbitrate the access rights of these controllers is needed.

The values of the flags WF1-2 and RF1-2 of the enable register ENR are set by the controller CNT1 when the system SYS is powered on. Therefore, the enable register ENR is assigned to an I/O space of the controller CNT1. Incidentally, the flags WF1-2 and RF1-2 may be each formed by a ROM such as a fuse circuit, and the values of the flags WF1-2 and RF1-2 may be set in the manufacturing process of the memory MEM.

The control signal CNT includes chip select signals CS1 and CS2 outputted from the controllers CNT1-2. For example, when the controller CNT1 activates the chip select signal CS1 in order to access the memory MEM, the conversion control unit CNVC outputs the encode enable signal ENCEN and the decode enable signal DECEN which indicate the values of the flags WF1 and RF1 in response to the activation of the chip select signal CS1.

Similarly, when the controller CNT2 activates the chip select signal CS2 in order to access the memory MEM without proper authorization, the conversion control unit CNVC outputs the encode enable signal ENCEN and the decode enable signal DECEN which indicate the values of the flags WF2 and RF2 in response to the activation of the chip select signal CS2. The operations of the encoder ENC and the decoder DEC are the same as those of the first embodiment.

In this embodiment, when the controller CNT1 which has the access right accesses the memory MEM, the memory MEM operates in the same manner as when it is accessed by the CPU of the first embodiment. When the controller CNT2 which does not have the access right gets write access to the memory MEM, the conversion control unit CNVC outputs the encode enable signal ENCEN indicating that the write access is disabled. Therefore, the encoding function of the encoder ENC becomes disabled. Moreover, the operation control circuit OPC does not output a write control signal for operating the memory cell array ARY in order to prohibit the write operation.

When the controller CNT2 which does not have the access right gets read access to the memory MEM, the conversion control unit CNVC outputs the decode enable signal DECEN indicating that the read access is disabled. The decoding function of the decoder DEC becomes disabled, and encoded data read from the memory cell array ARY is outputted directly to the data terminal DT. Incidentally, the decoder DEC may output data (all 0 data, all 1 data, or the like) whose value is fixed to the data terminal DT when the decoding function is disabled. Alternatively, when the controller CNT2 which does not have the access right gets read access to the memory MEM, the operation control signal OPC may prohibit an output of a read control signal for operating the memory cell array ARY. In this case, disabled data is read from the memory cell array ARY.

As described above, also in the seventh embodiment, the same effect as in the first embodiment can be obtained. Moreover, when receiving an access request from the controller CNT2 which does not have the access right, the memory MEM can prohibit the write operation or can prohibit the normal read operation. Accordingly, the security of data held in the memory MEM can be protected.

Figure 8:
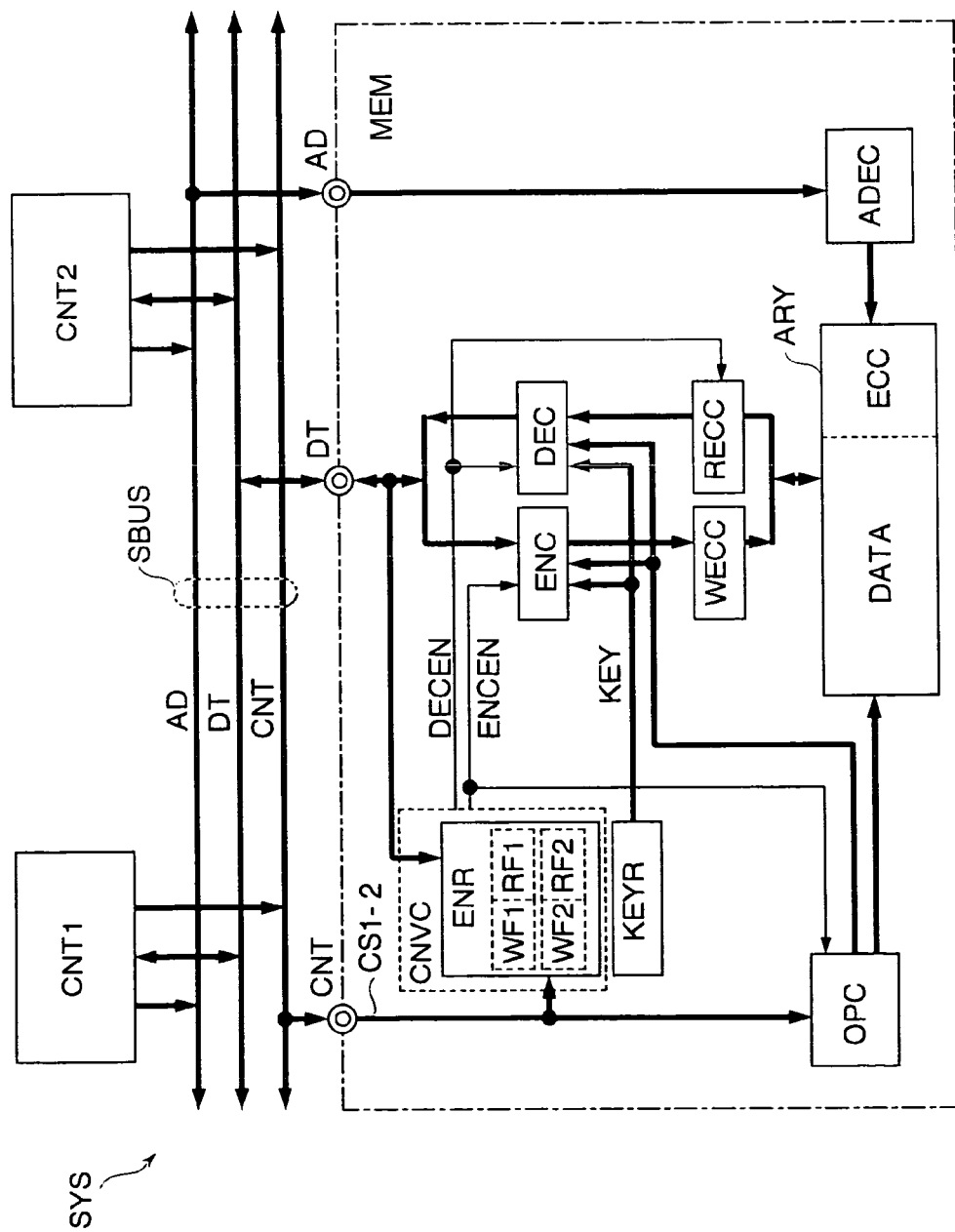
FIG. 8 is a block diagram showing an eighth embodiment of the present invention.

FIG. 8 shows an eighth embodiment of the present invention. The same symbols are used to designate elements of the same kinds as those described in the first, fifth, and seventh embodiments, and a detailed description thereof is omitted. This embodiment is applied to the semiconductor memory MEM connected to plural controllers CNT1-2 such as the CPU and the like via the system bus SBUS. Note, however, that, for example, the controller CNT1 has the access right to the semiconductor memory MEM. The controller CNT2 does not have the access right to the semiconductor memory MEM. The enable register ENR of the semiconductor memory MEM is the same as that of the seventh embodiment. The other configuration of the semiconductor memory MEM is substantially the same as that of the fifth embodiment (FIG. 5). Namely, the semiconductor memory MEM has the data error correcting function.

In this embodiment, when the controller CNT1 which has the access right accesses the memory MEM, the memory MEM performs the same operation as when it is accessed by the CPU of the fifth embodiment. When the controller CNT2 which does not have the access right gets write access to the memory MEM, the memory MEM performs the same operation as in the seventh embodiment. Namely, the write operation is not performed.

When the controller CNT2 which does not have the access right gets read access to the memory MEM, the conversion control unit CNVC outputs the decode enable signal DECEN indicating that the read access is disabled to the decoder DEC and the error correcting unit RECC. The error correcting unit RECC disables the error correcting function and outputs data whose error is not corrected to the decoder DEC. The decoder DEC disables the decoding function and outputs encoded data read from the memory cell array ARY to the data terminal DT. Namely, invalid read data is outputted from the memory MEM. As described above, also in the eighth embodiment, the same effect as in the first, fifth, and seventh embodiments can be obtained.

Figure 9:
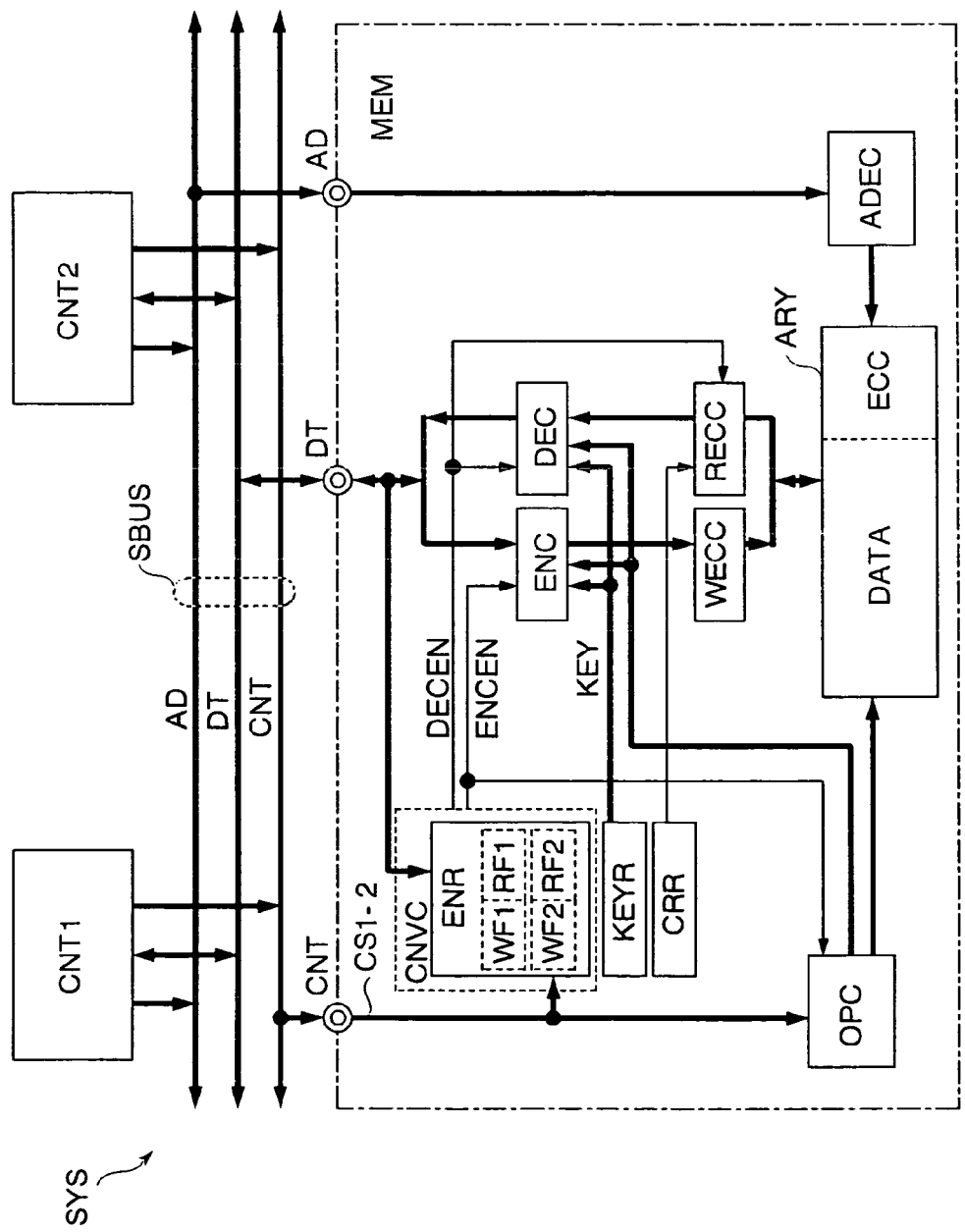
FIG. 9 is a block diagram showing a ninth embodiment of the present invention.

FIG. 9 shows a ninth embodiment of the present invention. The same symbols are used to designate elements of the same kinds as those described in the first, fifth, seventh, and eighth embodiments, and a detailed description thereof is omitted. The semiconductor memory MEM of this embodiment is formed by adding a correction register CRR to the eighth embodiment. For example, the controller CNT1 has the access right to the semiconductor memory MEM. The controller CNT2 does not have the access right to the semiconductor memory MEM. The other configuration of the semiconductor memory MEM is substantially the same as that of the eighth embodiment (FIG. 8). The correction register CRR is assigned to the I/O space of the controller CNT1 and can be rewritten by the controller CNT1.

When the controller CNT2 which does not have the access right gets read access to the memory MEM, the conversion control unit CNVC outputs the decode enable signal DECEN indicating that the read access is disabled to the decoder DEC and the error correcting unit RECC. When the value of the correction register CRR indicates "disable", the error correcting unit RECC disables the error correcting function and outputs data whose error is not corrected to the decoder DEC. When the value of the correction register CRR indicates "enable", the error correcting unit RECC enables the error correcting function and outputs data whose error is corrected to the decoder DEC. The decoder DEC disables the decoding function and outputs encoded data read from the memory cell array ARY (whose error is corrected in some cases and not corrected in other cases) to the data terminal DT. Namely, the value of disabled data read from the memory MEM differs according to the value of the correction register CRR.

As described above, also in the ninth embodiment, the same effect as in the first, fifth, and seventh embodiments can be obtained. Moreover, the value of disabled data can be made different according to the value of the correction register CRR. Accordingly, the security of data held in the memory MEM can be certainly protected.

Figure 10:
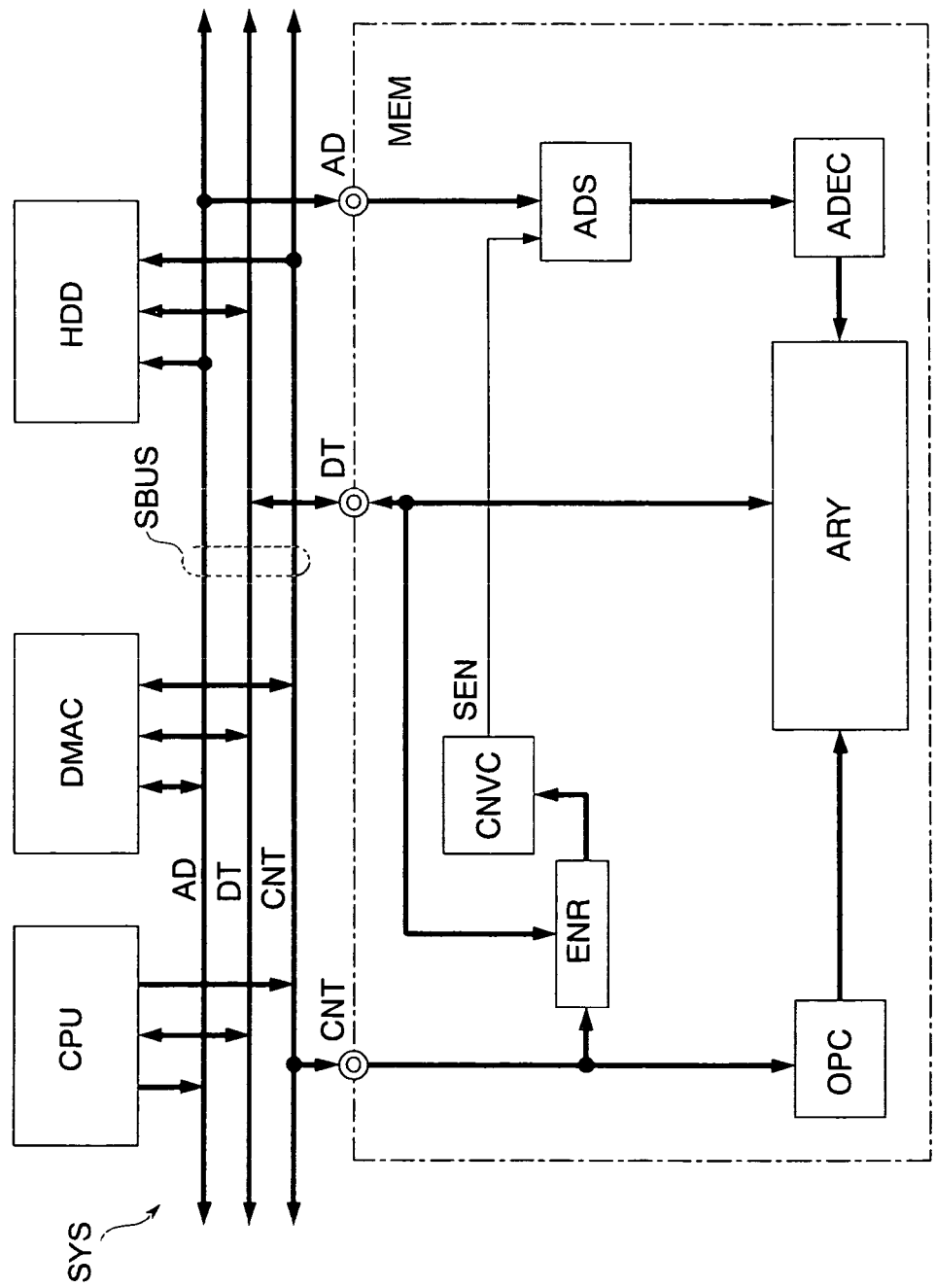
FIG. 10 is a block diagram showing a tenth embodiment of the present invention.

FIG. 10 shows a tenth embodiment of the present invention. The same symbols are used to designate elements of the same kinds as those described in the first embodiment, and a detailed description thereof is omitted. The semiconductor memory MEM of this embodiment includes the conversion control unit CNVC, the enable register ENR, the operation control circuit OPC, the memory cell array ARY, an address scramble unit ADS, and the address decoder ADEC.

The conversion control unit CNVC activates a scramble enable signal SEN to a high level when the enable register ENR is set and deactivates the scramble enable signal SEN to a low level when the enable register ENR is reset. The enable register ENR stores enable information indicating that the address scramble unit ADS is enabled/disabled. The enable register ENR can be rewritten from outside the memory MEM. For example, the enable register ENR is assigned to the I/O space of the CPU.

The address scramble unit ADS scrambles bits of the address AD received by the external address terminal AD under a predetermined rule (address scrambling) and outputs the scrambled address AD to the address decoder ADEC when the scramble enable signal SEN is activated. The address scramble unit ADS outputs the address AD received by the external address terminal AD as it is to the address decoder ADEC when the scramble enable signal SEN is deactivated.

For example, the scrambling of the address AD is performed by an EOR operation of respective bits of the address AD and a previously determined value. The previously determined value here has the same number of bits as the address AD.

In this embodiment, when getting write access and read access to the memory MEM, the CPU sets the enable register ENR in order to enable an address scrambling function. When transferring data between the memory MEM and the HDD using the DMAC, the CPU resets the enable register ENR to disable the address scrambling function. Consequently, data whose address AD is scrambled is transferred to the HDD. In other words, data whose address AD is not scrambled can be read only by the CPU. Therefore, the security of data written into the memory MEM can be protected. As described above, also in the ninth embodiment, the same effect as in the first embodiment can be obtained.

The address scramble unit ADS functions as a write data conversion unit which coverts the address AD indicating the place where write data supplied from outside is to be stored into a scramble address. The address scramble unit ADS further functions as a read data conversion unit which converts the address AD supplied from outside in order to read data from the memory MEM into a scramble address. The write data supplied from outside (external data) is written into a memory cell indicated by the scramble address. Hence, even any controller other than the CPU supplies the original address to the memory MEM, the external data cannot be read. Namely, the external data is converted into internal data by the address scramble unit ADS. Similarly, data stored in the memory cell array ARY (internal data) is read as original data (external data) only when being read from the memory cell indicated by the scramble address.

Figure 11:
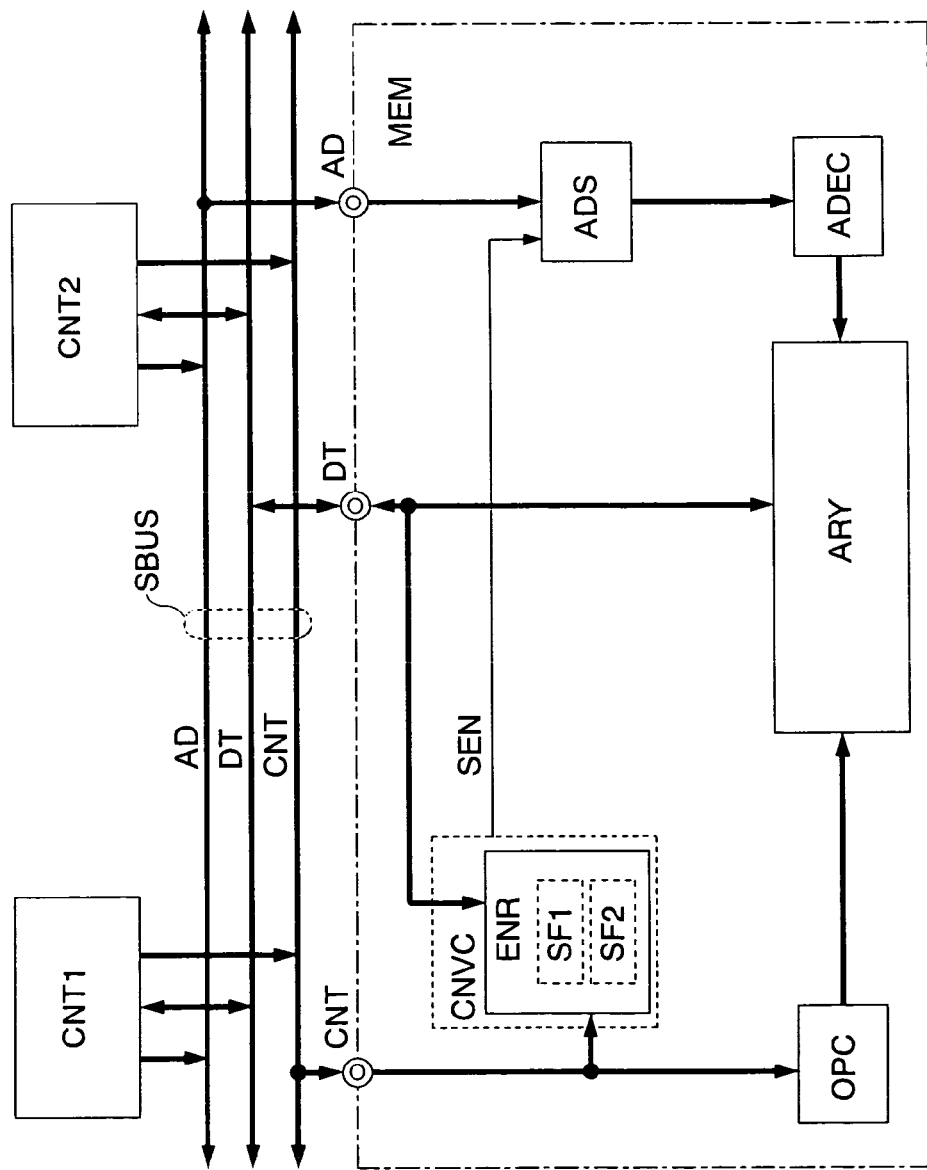
FIG. 11 is a block diagram showing an eleventh embodiment of the present invention.

FIG. 11 shows an eleventh embodiment of the present invention. The same symbols are used to designate elements of the same kinds as those described in the first and tenth embodiments, and a detailed description thereof is omitted. This embodiment is applied to the semiconductor memory MEM connected to the plural controllers CNT1-2 such as the CPU and the like via the system bus SBUS. For example, the controller CNT1 has the access right to the semiconductor memory MEM. The controller CNT2 does not have the access right to the semiconductor memory MEM. The semiconductor memory MEM is the same as that of the tenth embodiment except for the enable register ENR.

The enable register ENR includes scramble flags SF1 and SF2 which correspond to the controllers CNT1-2, respectively. The values of the scramble flags SF1 and SF2 are set by the controller CNT1 when the system SYS is powered on. Therefore, the enable register ENR is assigned to the I/O space of the controller CNT1. In this example, the scramble flags SF1-2 are set and reset, respectively. As just described, when the controller (CNT1 or CNT2) has the access right, the scramble flag (SF1 or SF2) is reset. When the controller (CNT1 or CNT2) does not have the access right, the scramble flag (SF1 or SF2) is reset.

The control signal CNT includes the chip select signals CS1 and CS2 outputted from the controllers CNT1-2. For example, when the controller CNT1 activates the chip select signal CS1 in order to access the memory MEM, the conversion control unit CNVC outputs the scramble enable signal SEN which indicates the value of the scramble flag SF1 in response to the activation of the chip select signal CS1. The conversion control unit CNVC outputs the scramble enable signal SEN which indicates the value of the scramble flag SF2 in response to the activation of the chip select signal CS2.

In this embodiment, when the controller CNT1 which has the access right accesses the memory MEM, the address scrambling function becomes enabled. Therefore, the controller CNT1 can normally access the memory MEM. On the other hand, when the controller CNT2 which does not have the access right accesses the memory MEM without proper authorization, the address scrambling function becomes disabled. Simultaneously, in the case of write access, the operation control circuit OPC prohibits an output of the write control signal in response to the deactivation of the scramble enable signal SEN. Therefore, the controller CNT2 cannot write data into the memory MEM in the write access and cannot read normal data from the memory MEM in the read access. As described above, also in the eleventh embodiment, the same effect as in the first and tenth embodiments can be obtained.

The above first to seventh embodiments have described the example in which the HDD is connected to the system bus SBUS. However, the HDD may be connected to an independent bus different from the system bus SBUS. In this case, the DMAC which transfers data between the memory MEM and the HDD is connected to the independent bus.

The above first to fifth and seventh embodiments have described the example in which the logics of the enable signals DECEN and ENCEN are changed according to the values set in the enable register ENR. However, the logics of the enable signals DECEN and ENCEN may be changed by directly rewriting latch information and so on of the conversion control unit CNVC from outside the memory MEM without the enable register ENR being formed.

The above eighth embodiment has described the example in which when the controller CNT2 which does not have the access right requests read access, the error correction by the error correcting unit RECC is not performed. However, in this case, the function of the decoder DEC is disabled, and therefore the error correction by the error correcting unit RECC may be performed.

The above third to ninth embodiments can be applied to the semiconductor memory MEM having the data compressing function and decompressing function of the second embodiment.

The error correcting function of the fifth, eighth, and ninth embodiments may be added to the tenth to eleventh embodiments (address scrambling function). Alternatively, the address scramble unit ADS of the tenth to eleventh embodiments may be formed on the field programmable unit FP of the sixth embodiment.

In the tenth to eleventh embodiments, a dedicated program input terminal to write a program into the program area PRG may be formed.

The semiconductor memory to which the present invention is applied is not limited to the FCRAM or the flash memory, and it may be a DRAM, an SDRAM, a pseudo SRAM, an SRAM, or an EEPROM. Moreover, the present invention may be applied to a semiconductor memory connected to three or more controllers.

The invention is not limited to the above embodiments and various modifications may be made without departing from the spirit and scope of the invention. Any improvement may be made in part or all of the components.

What is claimed is:

1. A semiconductor memory comprising:
   a write data conversion unit which converts external data supplied from outside into internal data;
   a memory cell array which includes a memory cell storing the internal data;
   a read data conversion unit which converts the internal data read from said memory cell array into the original external data;
   a conversion control unit which sets enabled/disabled a function of one of said write data conversion unit and said read data conversion unit for each of controllers inputting or outputting data to or from said memory cell array; and
   an area register changing a size of a memory area assigned to said memory cell array in order to store the internal data.

2. The semiconductor memory according to claim 1, further comprising
   an access register which is able to set an access right to said memory cell array for each of the controllers.

3. A semiconductor memory comprising:
   a write data conversion unit which converts external data supplied from outside into internal data;
   a memory cell array which includes a memory cell storing the internal data;
   a read data conversion unit which converts the internal data read from said memory cell array into the original external data;
   a conversion control unit which sets enabled/disabled a function of one of said write data conversion unit and said read data conversion unit for each of controllers inputting or outputting data to or from said memory cell array;
   a code generating unit which generates an error correction code to correct an error in the internal data; and
   an error correcting unit which detects an error in the internal data using said error correction code and corrects the error when it is correctable, wherein said memory cell array includes an error code area which stores said error correction code.

4. The semiconductor memory according to claim 3, wherein when detecting that there is a correctable error in the internal data read from said memory cell array, said error correcting unit corrects the error in the internal data only when said read data conversion unit is set enabled.

5. The semiconductor memory according to claim 4, wherein when detecting that there is a correctable error in the internal data read from said memory cell array, said error correcting unit does not correct the error in the internal data when said read data conversion unit is set disabled.

6. The semiconductor memory according to claim 4, wherein when detecting that there is a correctable error in the internal data read from said memory cell array, said error correcting unit corrects the error in the internal data when said read data conversion unit is set disabled.

7. The semiconductor memory according to claim 4, further comprising a correction register in which a correction flag is stored, wherein when said read data conversion unit is set disabled, said error correcting unit determines whether or not to correct the error in the internal data according to a value of the correction flag when detecting that there is a correctable error in the internal data read from said memory cell array.

8. A semiconductor memory comprising:

a write data conversion unit which converts external data supplied from outside into internal data;

a memory cell array which includes a memory cell storing the internal data;

a read data conversion unit which converts the internal data read from said memory cell array into the original external data; and a conversion control unit which sets enabled/disabled a function of one of said write data conversion unit and said read data conversion unit for each of controllers inputting or outputting data to or from said memory cell array, wherein said write data conversion unit converts, into a scramble address, an address which is supplied from outside and indicates a place where the external data is to be stored;

said read data conversion unit converts, into the scramble address, the address to read the external data, the external data is converted into the internal data by being written into a memory cell indicated by the scramble address, and the internal data is converted to the original external data by being read from the memory cell indicated by the scramble address.

9. A semiconductor memory comprising:

a write data conversion unit which converts external data supplied from outside into internal data;

a memory cell array which includes a memory cell storing the internal data;

a read data conversion unit which converts the internal data read from said memory cell array into the original external data;

a conversion control unit which sets enabled/disabled a function of one of said write data conversion unit and said read data conversion unit for each of controllers inputting or outputting data to or from said memory cell array;

a field programmable unit in which logic is programmable; and a nonvolatile program area in which a program to construct the logic in said field programmable unit is stored, wherein said write data conversion unit and said read data conversion unit are formed in said field programmable unit.

10. The semiconductor memory according to claim 9, wherein said memory cell array includes the memory cell which is nonvolatile; and said program area is formed by using part of said memory cell array.

11. The semiconductor memory according to claim 9, further comprising a program input terminal through which the program is stored in said program area.

* * * * *